United States Patent
Hwang et al.

(10) Patent No.: US 9,543,470 B2
(45) Date of Patent: Jan. 10, 2017

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Kyung Wook Hwang, Hwaseong-si (KR); Jae Hyeok Heo, Suwon-si (KR); Joong Kon Son, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/452,309

(22) Filed: Aug. 5, 2014

(65) Prior Publication Data
US 2015/0041822 A1  Feb. 12, 2015

(30) Foreign Application Priority Data
Aug. 6, 2013  (KR) ........................ 10-2013-0092956

(51) Int. Cl.
*H01L 33/10* (2010.01)
*H01L 33/24* (2010.01)

(52) U.S. Cl.
CPC .............. *H01L 33/10* (2013.01); *H01L 33/24* (2013.01)

(58) Field of Classification Search
CPC ....................................................... H01L 33/60
USPC ........................................................... 257/98
See application file for complete search history.

(56) References Cited

U.S. PATENT DOCUMENTS

| | | | |
|---|---|---|---|
| 5,939,732 A * | 8/1999 | Kurtz | .................... H01L 33/105 257/103 |
| 6,372,608 B1 | 4/2002 | Shimoda et al. | |
| 6,376,859 B1 * | 4/2002 | Swanson | ........... H01L 21/02203 257/49 |
| 6,645,830 B2 | 11/2003 | Shimoda et al. | |
| 6,683,367 B1 * | 1/2004 | Stalmans et al. | ............. 257/618 |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |

(Continued)

FOREIGN PATENT DOCUMENTS

| | | |
|---|---|---|
| KR | 10-1994-0001472 A | 1/1994 |
| KR | 10-1999-0011945 A | 2/1999 |

(Continued)

*Primary Examiner* — Daniel Whalen
*Assistant Examiner* — Suberr Chi
(74) *Attorney, Agent, or Firm* — F. Chau & Associates, LLC

(57) ABSTRACT

A semiconductor light emitting device includes a substrate, a reflective layer and a light emitting structure. The reflective layer includes at least two porous layers alternately disposed on the substrate and having different porosities. The light emitting structure is disposed on the reflective layer and includes a first conductivity-type semiconductor layer, an active layer and a second conductivity-type semiconductor layer.

14 Claims, 15 Drawing Sheets

(56) References Cited

U.S. PATENT DOCUMENTS

| | | |
|---|---|---|
| 7,501,656 B2 | 3/2009 | Han et al. |
| 7,601,989 B2 | 10/2009 | Epler et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2008/0315228 A1* | 12/2008 | Krames et al. ............... 257/98 |
| 2010/0038661 A1 | 2/2010 | Chen et al. |
| 2010/0252850 A1* | 10/2010 | Park ................ H01L 21/0237 257/98 |
| 2012/0007118 A1* | 1/2012 | Choi ................ H01L 33/382 257/98 |
| 2012/0153304 A1* | 6/2012 | Schubert et al. ............. 257/79 |
| 2012/0235189 A1* | 9/2012 | Hsu ............................... 257/98 |
| 2013/0011656 A1* | 1/2013 | Zhang ................ C25F 3/12 428/312.8 |
| 2014/0042422 A1* | 2/2014 | Silverman et al. ........... 257/40 |

FOREIGN PATENT DOCUMENTS

| | | |
|---|---|---|
| KR | 10-2003-0032133 A | 4/2003 |
| KR | 10-2005-0037323 A | 4/2005 |
| KR | 10-0734810 B1 | 7/2007 |
| KR | 10-0843408 B1 | 7/2008 |
| KR | 10-2013-0021931 A | 3/2013 |
| KR | 10-1245509 B1 | 3/2013 |
| KR | 10-2013-0035685 A | 4/2013 |
| WO | 2005/038889 A1 | 4/2005 |

* cited by examiner

SEMICONDUCTOR LIGHT EMITTING DEVICE

CROSS-REFERENCE TO RELATED APPLICATION

This application claims priority to, and benefit of Korean Patent Application No. 10-2013-0092956 filed on Aug. 6, 2013, with the Korean Intellectual Property Office, the entire content of which is hereby incorporated by reference.

TECHNICAL FIELD

The present disclosure relates to a semiconductor light emitting device.

BACKGROUND

A nitride semiconductor light emitting device has been highly developed in terms of design and manufacturing technology, thereby contributing to improvements in efficiency and output of white light emitting diodes (LEDs), as well as blue, green and ultraviolet (UV) short-wavelength LEDs. As a result of these developments, the applications of nitride semiconductor light emitting devices have been extended to headlamps of vehicles and general lighting devices. Accordingly, there is a need for a reduction of manufacturing costs in order to substitute existing light sources such as fluorescent lamps and the like.

In order to improve manufacturing yields, research is being conducted to replace a sapphire substrate with a wafer formed of a different material, such as a silicon substrate or the like, which is relatively cheap and able to have a large diameter. In this regard, development is needed in methods of securing crystalline properties in nitride single crystals grown on a substrate and improving light emitting efficiency by preventing photons generated in an active layer from being absorbed by the substrate.

SUMMARY

An aspect of the present disclosure may provide a semiconductor light emitting device manufactured by a simple process and having improved light emitting efficiency.

One aspect of the present disclosure relates to a semiconductor light emitting device including a substrate, a reflective layer including at least two porous layers alternately disposed on the substrate and having different porosities, and a light emitting structure disposed on the reflective layer and including a first conductivity-type semiconductor layer, an active layer and a second conductivity-type semiconductor layer.

The porous layers included in the reflective layer may include the same material as the material of at least one of the substrate, the first conductivity-type semiconductor layer and the second conductivity-type semiconductor layer.

The substrate may include silicon (Si), and the porous layers may include porous Si.

The porous layers included in the reflective layer may include the same material as the material of the substrate.

The first conductivity-type semiconductor layer may include GaN, and the porous layers may include porous GaN.

The reflective layer may reflect light generated in the active layer and travelling to the substrate, toward a top portion of the light emitting structure.

The reflective layer may include a first porous layer having a first porosity and a second porous layer having a second porosity lower than the first porosity.

The first porous layer may have a refractive index lower than that of the second porous layer.

The first porous layer may have a resistivity higher than that of the second porous layer.

A difference between the refractive indices of the first porous layer and the second porous layer may be in a range of 0.1 to 1.3.

The at least two porous layers may have different thicknesses.

The semiconductor light emitting device may further include a buffer layer disposed between the reflective layer and the light emitting structure.

The semiconductor light emitting device may further include a plurality of protrusions disposed on the reflective layer.

The semiconductor light emitting device may further include a first electrode connected to the first conductivity-type semiconductor layer and a second electrode connected to the second conductivity-type semiconductor layer, wherein the first electrode may include a conductive via penetrating the reflective layer and the substrate and connected to the first conductivity-type semiconductor layer.

The at least two porous layers may be alternately repeated twice or more.

Another aspect of the present disclosure encompasses a semiconductor light emitting device including a light shielding substrate, a light emitting structure disposed above the light shielding substrate, and a reflective layer including at least two porous layers having different porosities, disposed between the light shielding substrate and the light emitting structure.

The at least two porous layers may be alternately repeated twice or more.

Still another aspect of the present disclosure relates to a semiconductor light emitting device including a substrate, a reflective layer including first, second and third porous layers that are alternately disposed on the substrate and have different porosities, and a light emitting structure disposed on the reflective layer and including a first conductivity-type semiconductor layer, an active layer and a second conductivity-type semiconductor layer. One of the first, second and third porous layers has a porosity of 0.

The first, second and third porous layers may be alternately repeated twice or more.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
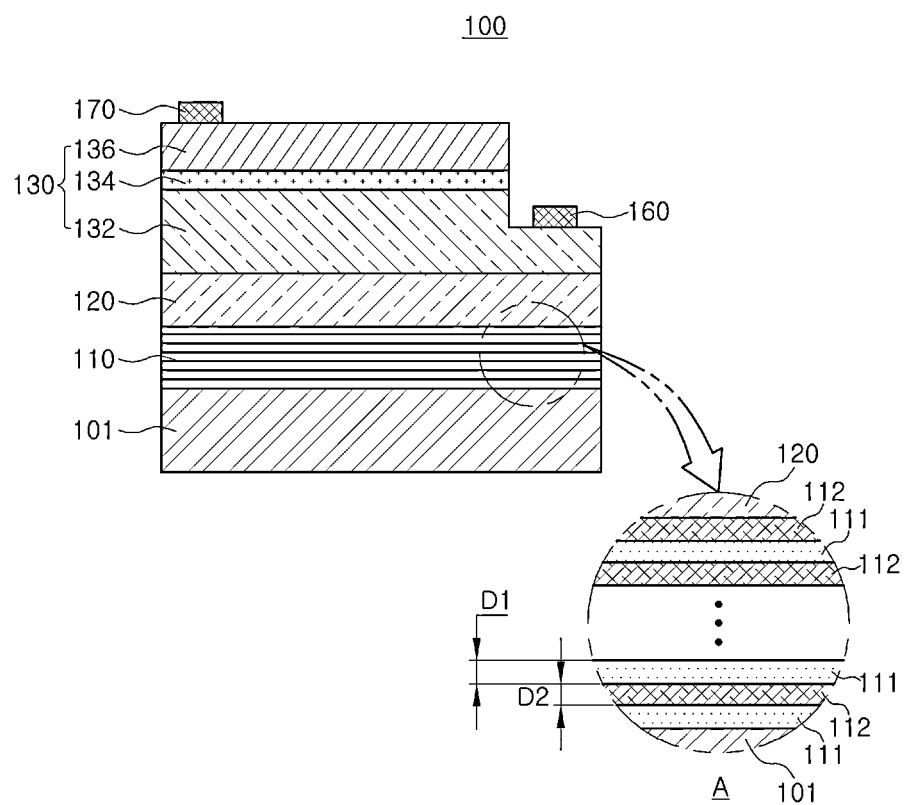
FIG. 1 is a schematic cross-sectional view illustrating a semiconductor light emitting device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a schematic cross-sectional view illustrating a semiconductor light emitting device according to an exemplary embodiment of the present disclosure.

With reference to FIG. 1, a semiconductor light emitting device 100 according to an exemplary embodiment of the present disclosure may include a substrate 101, a reflective layer 110 disposed on the substrate 101, a buffer layer 120 and a light emitting structure 130, and may further include a first electrode 160 and a second electrode 170 disposed on the light emitting structure 130. The light emitting structure 130 may include a first conductivity-type semiconductor layer 132, an active layer 134 and a second conductivity-type semiconductor layer 136. Here, the terms "top," "top portion," "top surface," "bottom," "bottom portion," "bottom surface," "lateral surface," and the like, are based on the directionality of the drawings, which may be changed according to a direction in which a semiconductor light emitting device is actually mounted.

The substrate 101 may be provided as a substrate for semiconductor growth, and may also be a light shielding substrate formed of a light shielding material. Throughout the specification, the term "light shielding" refers to the properties of a material or a member blocking penetration of light by absorbing or reflecting a majority of incident light. When the substrate 101 has light shielding properties, the substrate 101, for example, may not allow for the transmission of the majority of incident light by absorbing approximately 50% of incident light having a wavelength of 1000 nm or less and reflecting the remainder thereof. The substrate 101 may be, for example, a silicon (Si) substrate, and the Si substrate may be easily formed to have a large diameter and may be relatively cheap, whereby manufacturing yields may be improved.

The reflective layer 110 refers to a reflective structure for redirecting light travelling toward the substrate 101, from among light generated in the active layer 134, toward a top portion of the light emitting structure 130. The reflective layer 110 may be an omni-directional reflector (ODR).

The reflective layer 110 may be formed of a single porous material. In addition, the reflective layer 110 may be formed of the same material as a material of at least one of the substrate 101, the first conductivity-type semiconductor layer 132, and the second conductivity-type semiconductor layer 136, while being provided as a porous layer formed of the same material. For example, the substrate 101 may be formed of Si and the reflective layer 110 may be formed of porous Si. Alternatively, the first conductivity-type semiconductor layer 132 may be formed of GaN, and the reflective layer 110 may be formed of porous GaN. The present inventive concept is not limited thereto, and according to exemplary embodiments of the present inventive concept, the reflective layer 110 may include porous layers formed of a different material from a material of the substrate 101 or the light emitting structure 130.

As illustrated in an enlarged view of a region A including the reflective layer 110 (see FIG. 1), the reflective layer 110 may include first and second porous layers 111 and 112 having different porosities and alternately disposed therein. The first and second porous layers 111 and 112 may be alternately disposed at least once. For example, the reflective layer 110 may have a structure in which first and second porous layers 111 and 112 are alternately disposed twice or more, or may have a structure in which a single first porous layer 111 and a single second porous layer 112 are disposed.

For example, the first porous layer 111 may have a first porosity and the second porous layer 112 may have a second porosity lower than the first porosity. Since a pore has the same refractive index as a refractive index of air, the higher the porosity is, the lower the refractive index is. Therefore, the first porous layer 111 may have a refractive index lower than a refractive index of the second porous layer 112. In addition, the first porous layer 111 may have a resistivity higher than a resistivity of the second porous layer 112. This will be described in detail with reference to FIGS. 8A and 8B.

The first and second porous layers 111 and 112 may have a refractive index ranging from 1.2 to 2.8. A difference between the refractive indices of the first and second porous layers 111 and 112 may range from 0.1 to 1.3. The refractive indices of the first and second porous layers 111 and 112 may be lower than refractive indices of the substrate 101 and the first conductivity-type semiconductor layer 132.

Referring to FIG. 1, the first porous layer 111 may have a first thickness D1 and the second porous layer 112 may have a second thickness D2. The first thickness D1 may be from the same as the second thickness D2. For example, when a wavelength of light generated in the active layer 134 is denoted as $\lambda$ and a refractive index of the active layer 134 is denoted as n, the first thickness D1 and the second thickness D2 may be $\lambda/4n$, but are not limited thereto. For example, the first thickness D1 may be different from the second thickness D2.

The reflective layer 110 may be designed to have high reflectivity of approximately 95% or greater with respect to the wavelength of light generated in the active layer 134, by appropriately selecting the refractive indices and thicknesses of the first and second porous layers 111 and 112. In addition, the repetition number of the first and second porous layers 111 and 112 may be determined to secure high reflectivity. For example, when a difference between the refractive indices of the first and second porous layers 111 and 112 is relatively large, the repetition number of the first and second porous layers 111 and 112 may be relatively low. On the contrary, when a difference between the refractive indices of the first and second porous layers 111 and 112 is relatively small, the repetition number of the first and second porous layers 111 and 112 may be relatively high. That is, a first repetition number of the first and second porous layers 111 and 112 having a first difference between the refractive indices the first and second porous layers 111 and 112 may be lower than a second repetition number of the first and second porous layers 111 and 112 having a second refractive indices difference that is smaller than the first refractive indices difference.

The buffer layer 120 may alleviate stress exerted on the first conductivity-type semiconductor layer 132 to improve crystalline properties, and may be formed of AlN, GaN or AlGaN. The buffer layer 120 may be omitted according to exemplary embodiments of the present disclosure.

The first and second conductivity-type semiconductor layers 132 and 136 may be formed of semiconductor materials doped with n-type and p-type impurities, respectively, but are not limited thereto. On the contrary, the first and second conductivity-type semiconductor layers 132 and 136 may be formed of semiconductor materials doped with p-type and n-type impurities, respectively. The first and second conductivity-type semiconductor layers 132 and 136 may be formed of a nitride semiconductor, for example, a material having a composition of $Al_xIn_yGa_{1-x-y}N$, where $0 \leq x \leq 1$, $0 \leq y \leq 1$, and $0 \leq x+y \leq 1$. Each of the first and second conductivity-type semiconductor layers 132 and 136 may be formed as a single layer or as a plurality of layers having different characteristics in terms of doping concentration, composition and the like. However, the first and second conductivity-type semiconductor layers 132 and 136 may also be formed of an AlInGaP or AlInGaAs semiconductor, besides the nitride semiconductor.

The active layer 134, disposed between the first and second conductivity-type semiconductor layers 132 and 136, may emit light having a predetermined level of energy according to a recombination of electrons and holes and may have a multi-quantum well (MQW) structure in which quantum well layers and quantum barrier layers are alternately laminated. For example, in the case of the nitride semiconductor, a GaN/InGaN structure may be used. Alternatively, a single quantum well (SQW) structure may also be used.

The first and second electrodes 160 and 170 may be electrically connected to the first and second conductivity-type semiconductor layers 132 and 136, respectively. The first and second electrodes 160 and 170 may be formed of an electrically conductive material. For example, the first and second electrodes 160 and 170 may be formed of one or more of silver (Ag), aluminum (Al), nickel (Ni), chromium (Cr), and the like. According to exemplary embodiments of the present disclosure, the first and second electrodes 160 and 170 may be transparent electrodes, and, for example, may be formed of ITO (Indium Tin Oxide), AZO (Aluminium Zinc Oxide), IZO (Indium Zinc Oxide), ZnO, GZO (ZnO:Ga), $In_2O_3$, $SnO_2$, CdO, $CdSnO_4$, or $Ga_2O_3$.

The positions and shapes of the first and second electrodes 160 and 170 as illustrated in FIG. 1 are merely exemplary, and may be varied according to embodiments of the present disclosure. Although not illustrated, an ohmic electrode layer may be further disposed on the second conductivity-type semiconductor layer 136. For example, the ohmic electrode layer may include p-GaN including high concentration p-type impurities. Alternatively, the ohmic electrode layer may be formed of a metal or a transparent conductive oxide.

The semiconductor light emitting device 100 according to an embodiment of the present disclosure may include the reflective layer 110 having a multilayer structure formed of porous layers, whereby light extraction efficiency may be secured without removing the substrate 101.

Figure 2:
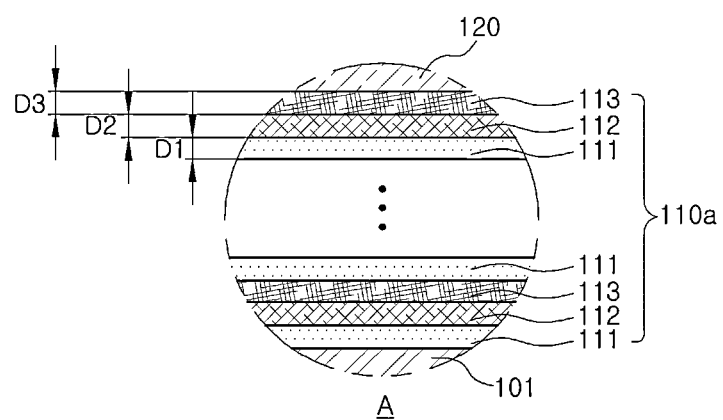
FIGS. 2 and 3 are enlarged views of a reflective layer applicable to a semiconductor light emitting device according to an exemplary embodiment of the present disclosure.
Figure 3:
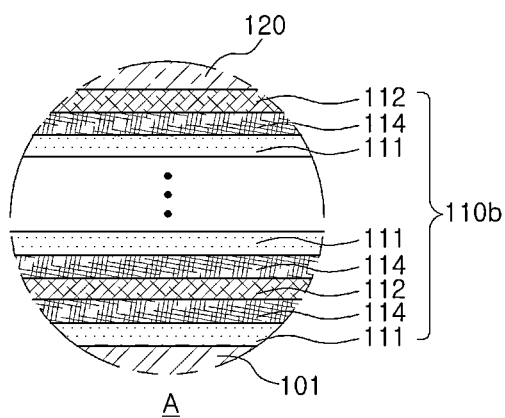

FIGS. 2 and 3 are enlarged views of a reflective layer applicable to a semiconductor light emitting device according to an exemplary embodiment of the present disclosure. Specifically, FIGS. 2 and 3 are enlarged views illustrating the region A of FIG. 1.

With reference to FIG. 2, a reflective layer 110a may have a multilayer structure of first, second and third porous layers 111, 112 and 113 repeatedly disposed at least once. The first, second and third porous layers 111, 112 and 113 may have different porosities, and accordingly may have different refractive indices. For example, the first porous layer 111 may have the highest porosity and the third porous layer 113 may have the lowest porosity.

In addition, the first, second and third porous layers 111, 112 and 113 may have different thicknesses D1, D2 and D3, respectively. For example, a first thickness D1 may have the largest value, and a third thickness D3 may have the smallest value.

According to exemplary embodiments of the present disclosure, the reflective layer 110a may have a structure in which three or more porous layers having different porosities are alternately repeated. In addition, according to exemplary embodiments of the present disclosure, any one of the first to third porous layers 111, 112 and 113 may have a porosity of 0. The reflective layer 110a may be formed to have a high reflectivity, regardless of an angle of incidence of light, by selecting the number of porous layers and respective porosities thereof.

With reference to FIG. 3, a reflective layer 110b may have a structure in which the first and second porous layers 111 and 112 are alternately repeated and a fourth porous layer 114 is interposed therebetween. The first, second and fourth porous layers 111, 112 and 114 may have different porosities, and accordingly may have different refractive indices and thicknesses.

FIGS. 4A through 4E are schematic cross-sectional views illustrating a method of manufacturing a semiconductor light emitting device according to an exemplary embodiment of the present disclosure.

Figure 4A:
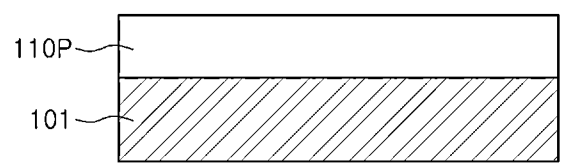
FIGS. 4A through 4E are schematic cross-sectional views illustrating a method of manufacturing a semiconductor light emitting device according to an exemplary embodiment of the present disclosure.

With reference to FIG. 4A, a laminate of the substrate 101 and a preliminary reflective layer 110P may be prepared.

The substrate 101 may be a substrate for semiconductor growth, for example, a wafer. The preliminary reflective layer 110P may be provided to form the reflective layer 110 by forming pores therein (see FIG. 1).

The substrate 101 and the preliminary reflective layer 110P are illustrated as separate layers. However, the preliminary reflective layer 110P may correspond to an upper portion of the substrate 101, and the preliminary reflective layer 110P and the substrate 101 may be formed of the same material. The present inventive concept is not limited thereto, and according to exemplary embodiments, the preliminary reflective layer 110P may be provided separately from the substrate 101.

Figure 4B:
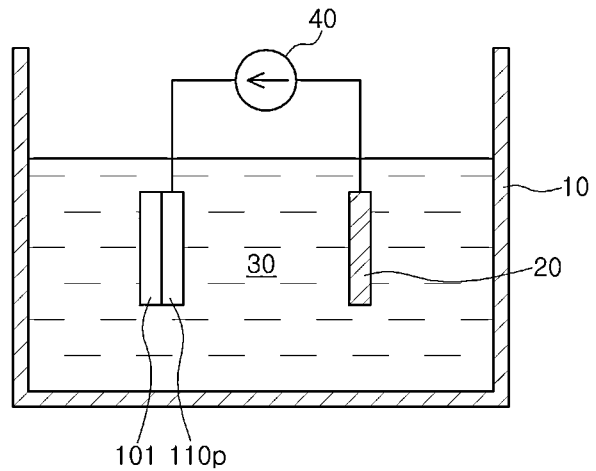
Figure 4C:
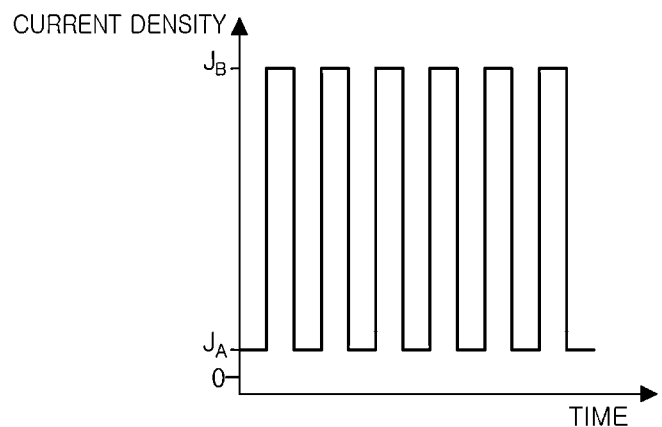

With reference to FIGS. 4B and 4C, an electrochemical etching may be performed on the preliminary reflective layer 110P.

As illustrated in FIG. 4B, the laminate of the substrate 101 and the preliminary reflective layer 110P may be immersed in an electrolyte solution 30 contained in a tank 10. The preliminary reflective layer 110P may be connected to a positive electrode of a power supply source 40, and an electrode 20 within the electrolyte solution 30 may be connected to a negative electrode thereof, such that the power supply source 40 may apply a predetermined level of voltage between the preliminary reflective layer 110P and the electrolyte solution 30. In this manner, the electrochemical etching may be performed on the preliminary reflective layer 110P, and the pores may be formed therein, whereby the porous reflective layer 110 may be formed.

The electrolyte solution 30 may be a solvent including at least one of hydrofluoric acid (HF), oxalic acid (COOH—COOH), potassium hydroxide (KOH), and hydrogen chloride (HCl). The electrode 20 may be formed of, for example, platinum.

During the electrochemical etching, as illustrated in FIG. 4C, the levels of voltage may be adjusted according to time, so that a current density may be varied, and first and second current densities $J_A$ and $J_B$ may be alternately applied to the preliminary reflective layer 110P. The preliminary reflective layer 110P may include the first and second porous layers 111 and 112 (see FIG. 1) having different porosities in a thickness direction thereof according to the varied current densities. Since an etching rate is varied according to the current densities, the first and second porous layers 111 and 112 respectively formed under the first and second current densities $J_A$ and $J_B$ may have different porosities. The formation of the first and second porous layers 111 and 112 will be described in detail with reference to FIGS. 6A through 7.

In an embodiment of the present disclosure, the electrochemical etching may be used to form the reflective layer 110 to thereby increase a difference between the refractive indices of the first and second porous layers 111 and 112, thereby facilitating a manufacturing process.

Figure 4D:
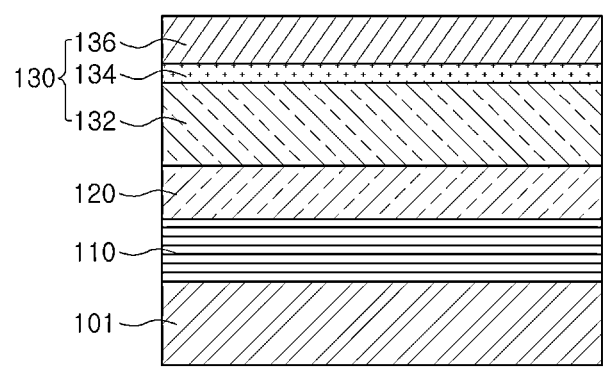

With reference to FIG. 4D, the buffer layer 120 and the light emitting structure 130 may be sequentially stacked on the reflective layer 110.

The buffer layer 120, the first and second conductivity-type semiconductor layers 132 and 136, and the active layer 134 may be grown by metal organic chemical vapor deposition (MOCVD), hydride vapor phase epitaxy (HVPE), molecular beam epitaxy (MBE), or the like.

When the reflective layer 110 is formed of the same material as a material of the substrate 101, a substrate for growing the light emitting structure 130, the light emitting structure 130 including the first conductivity-type semiconductor layer 132 may be stably grown on the buffer layer 120. Furthermore, when the reflective layer 110 is formed of the same material as that of the first conductivity-type semiconductor layer 132, the light emitting structure 130 including the first conductivity-type semiconductor layer 132 may be stably grown on the reflective layer 110. In this case, the buffer layer 120 may be disposed between the substrate 101 and the reflective layer 110.

Figure 4E:
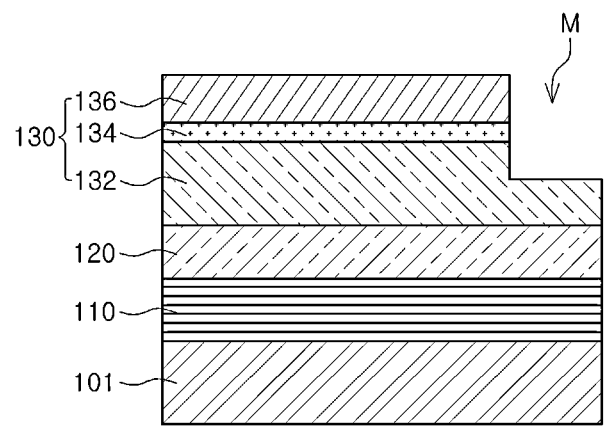

With reference to FIG. 4E, a region M of the light emitting structure 130 may be mesa-etched and removed.

A portion of the first conductivity-type semiconductor layer 132 may be exposed by the mesa-etching process. With reference to FIG. 1, the first and second electrodes 160 and 170 may be formed on upper surfaces of the first and second conductivity-type semiconductor layers 132 and 136, respectively. For example, the first and second electrodes 160 and 170 may be deposited by a physical vapor deposition (PVD) such as sputtering, electron beam evaporation, or the like.

In the semiconductor light emitting device according to an embodiment of the present disclosure, since light travelling toward the substrate 101 may be reflected toward the top portion of the light emitting structure 130 by the reflective layer 110, the removal process of the substrate 101 may be omitted.

Figure 5A:
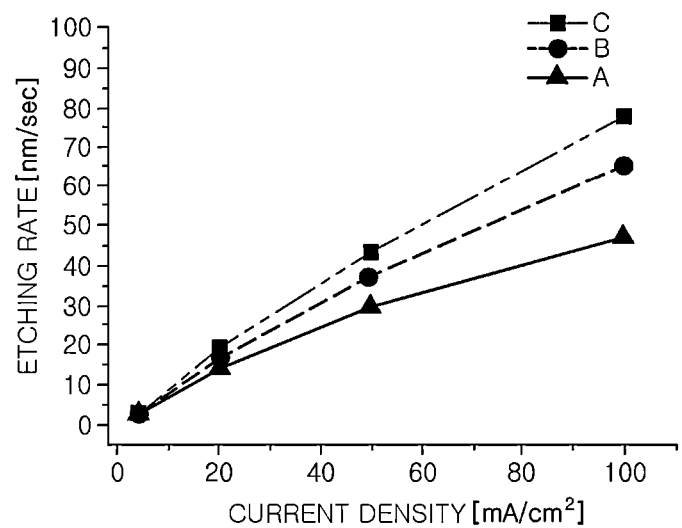
FIGS. 5A and 5B are graphs illustrating the manufacturing characteristics of a reflective layer adopted in a semiconductor light emitting device according to an exemplary embodiment of the present disclosure.
Figure 5B:
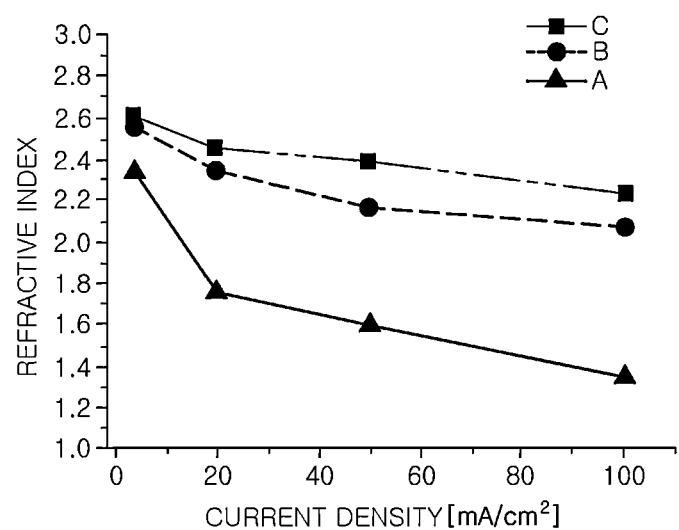

FIGS. 5A and 5B are graphs illustrating the manufacturing characteristics of a reflective layer adopted in a semiconductor light emitting device according to an exemplary embodiment of the present disclosure.

FIGS. 5A and 5B illustrate etching rates and refractive indices of porous layers forming a reflective layer according to current densities. In the graphs, "A," "B," and "C" refer to cases in which hydrofluoric acid (HF), ethanol (EtOH) and deionized water (DI water) forming an electrolyte solution had ratios of 1:1:1, 2:1:1 and 3:1:1, respectively, and here, the reflective layer was manufactured using Si.

As illustrated in FIG. 5A, as the current densities increase, the etching rates in all the electrolyte solutions may increase, and when an amount of HF is high, the etching rates may also increase. Therefore, the thicknesses of individual porous layers forming the reflective layer may be adjusted by controlling an etching time according to the electrolyte solutions and the current densities.

As illustrated in FIG. 5B, as the current densities increase, the refractive indices of the porous layers forming the manufactured reflective layer may decrease. When an amount of HF is high, the refractive indices may be relatively high. Therefore, the refractive indices of individual porous layers forming the reflective layer may be adjusted by appropriately selecting at least one of the electrolyte solutions and the current densities.

Figure 6A:
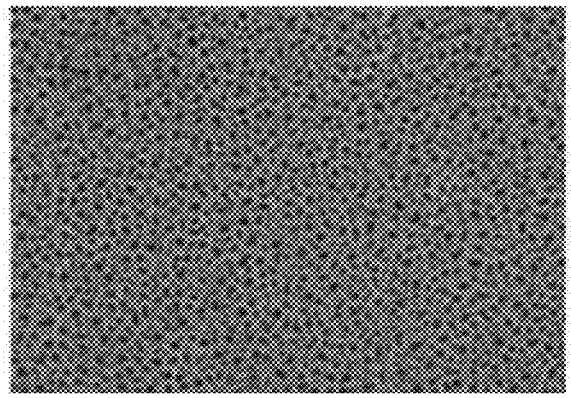
FIGS. 6A through 6C are electron microscope images of a reflective layer applicable to a semiconductor light emitting device according to an exemplary embodiment of the present disclosure.
Figure 6B:
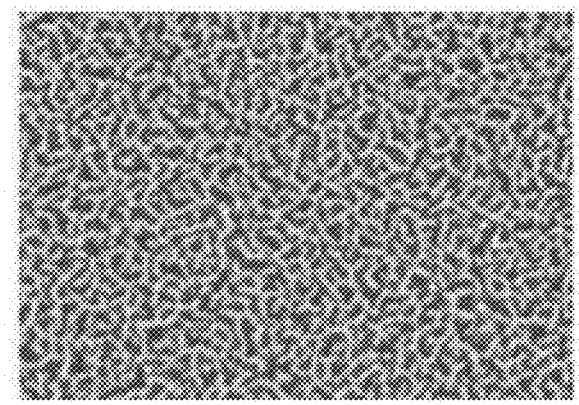
Figure 6C:
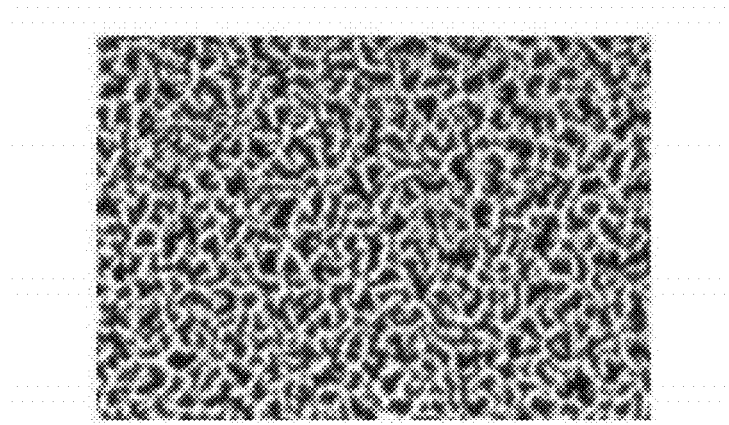

FIGS. 6A through 6C are electron microscope images of a reflective layer applicable to a semiconductor light emitting device according to an exemplary embodiment of the present disclosure. Specifically, FIGS. 6A through 6C illustrate the results of analyzing a surface of a reflective layer formed of Si using a scanning electron microscope (SEM).

With reference to FIGS. 6A through 6C, as current densities increase to 5 mA, 50 mA and 80 mA, the size of pores may increase. Generally, as the current density increases, porosity increases, and thus, a refractive index decreases. On the contrary, as the current density decreases, porosity decreases, and thus, the refractive index increases.

Figure 7:
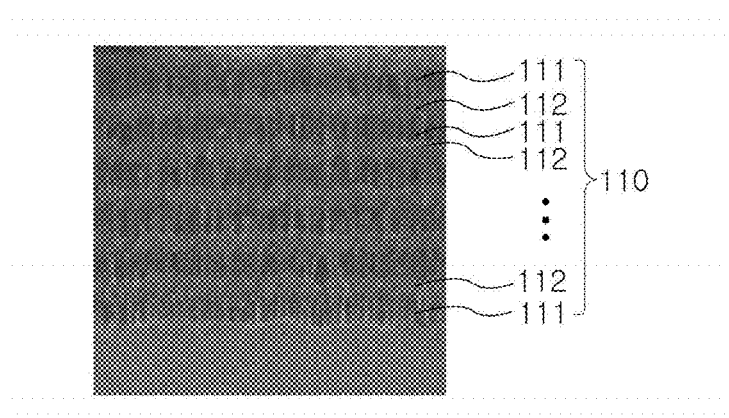
FIG. 7 is an electron microscope image of a reflective layer applicable to a semiconductor light emitting device according to an exemplary embodiment of the present disclosure.

FIG. 7 is an electron microscope image of a reflective layer applicable to a semiconductor light emitting device according to an exemplary embodiment of the present disclosure. Specifically, FIG. 7 illustrates the result of analyzing a cross-section of a reflective layer formed of Si using a scanning electron microscope (SEM).

With reference to FIG. 7, the reflective layer 110 may be formed to include the first and second porous layers 111 and 112 alternately disposed therein, according to current densities varied by changing a level of voltage according to time, as described above with reference to FIG. 4C. Since the etching process is performed from a top portion of the reflective layer 110, the reflective layer 110 may be formed in an order of upper layers to lower layers.

The first porous layer 111, appearing dark in the image of FIG. 7, has the higher porosity than the second porous layer 112 appearing bright therein. For example, the first porous layer 111 may be formed while the second current density $J_B$ of FIG. 4C is applied thereto, and the second porous layer 112 may be formed while the first current density $J_A$ of FIG. 4C is applied thereto.

Figure 8A:
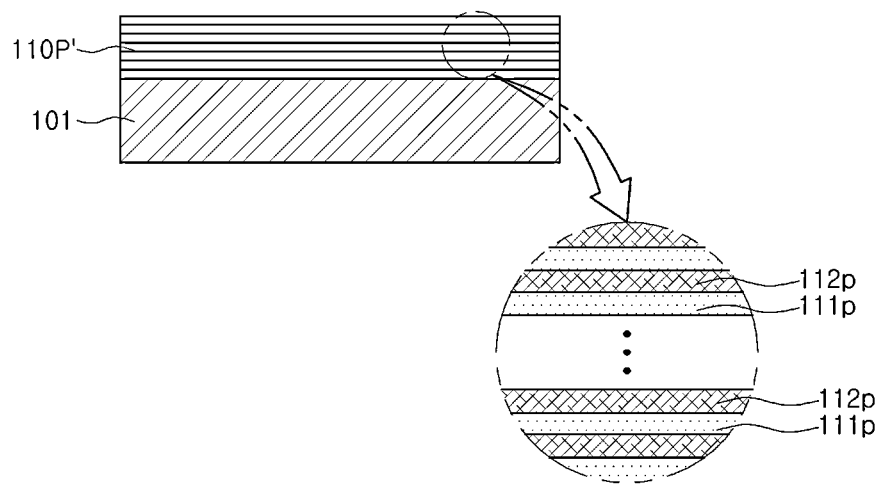
FIGS. 8A and 8B are schematic cross-sectional views illustrating a method of manufacturing a reflective layer adopted in a semiconductor light emitting device according to an exemplary embodiment of the present disclosure.

FIGS. 8A and 8E are schematic cross-sectional views illustrating a method of manufacturing a reflective layer adopted in a semiconductor light emitting device according to an exemplary embodiment of the present disclosure.

With reference to FIG. 8A, a laminate of the substrate 101 and a preliminary reflective layer 110P' may be prepared.

The substrate 101 may be a substrate for semiconductor growth, for example, a wafer. The preliminary reflective layer 110P' may be provided to form the reflective layer 110 by forming pores therein (see FIG. 1).

The preliminary reflective layer 110P' and the substrate 101 may be formed of the same material. Unlike the above embodiment described with reference to FIG. 4A, the preliminary reflective layer 110P' may include a plurality of first and second preliminary porous layers 111P and 112P alternately disposed therein. The first and second preliminary porous layers 111P and 112P may have different resistivities, which may be due to a difference in a doping degree of impurities.

Figure 8B:
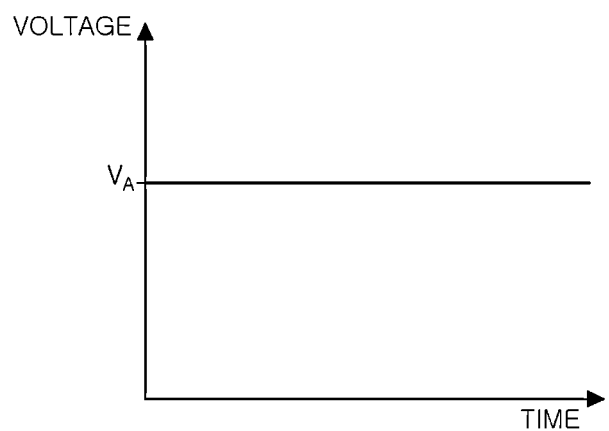

With reference to FIG. 8B, an electrochemical etching may be performed on the preliminary reflective layer 110P'.

The electrochemical etching may be performed in the same manner as that described above with reference to FIG. 4B. During the electrochemical etching, as illustrated in FIG. 8B, a predetermined level of voltage $V_A$ may be applied to the preliminary reflective layer 110P' without changing the level of voltage according to time.

The first and second preliminary porous layers 111P and 112P may have different resistivities, so that porous layers having different porosities and different refractive indices may be formed. For example, when the preliminary reflective layer 110P' is formed of Si, one of the first and second preliminary porous layers 111P and 112P having a resistivity lower than that of the other of the first and second preliminary porous layers 111P and 112P may form a porous layer having a refractive index higher than that of the other of the first and second preliminary porous layers 111P and 112P. On the contrary, one of the first and second preliminary porous layers 111P and 112P having a resistivity higher than that of the other of the first and second preliminary porous layers 111P and 112P may form a porous layer having a refractive index lower than that of the other of the first and second preliminary porous layers 111P and 112P. Particularly, in one of the first and second preliminary porous layers 111P and 112P having a relatively low resistivity, conductivity is high, and thus, the refractive indices of the porous layer formed from it may be relatively largely varied by changing current densities According to an embodiment of the present disclosure, a plurality of porous layers having different porosities and different refractive indices may be formed while power supplied at the time of the electrochemical etching is maintained constant.

Figure 9:
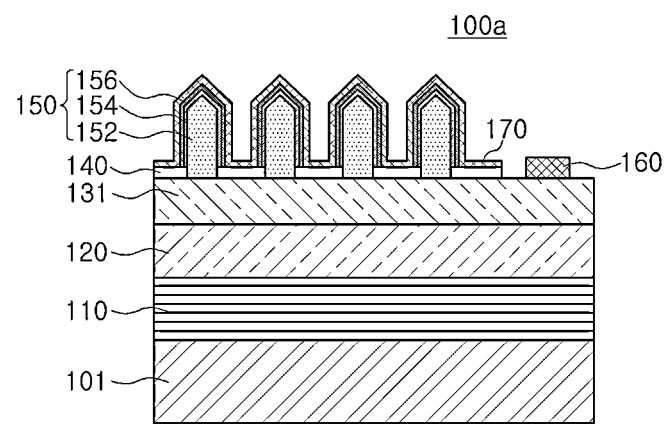
FIG. 9 is a schematic cross-sectional view illustrating a semiconductor light emitting device according to an exemplary embodiment of the present disclosure.

FIG. 9 is a schematic cross-sectional view illustrating a semiconductor light emitting device according to an exemplary embodiment of the present disclosure.

With reference to FIG. 9, a semiconductor light emitting device 100a according to an embodiment of the present disclosure may include the substrate 101, the reflective layer 110 disposed on the substrate 101, the buffer layer 120, a first conductivity-type semiconductor base layer 131, an insulating layer 140 and light emitting nano-structures 150, and may further include the first electrode 160 disposed on the first conductivity-type semiconductor base layer 131 and the second electrode 170 disposed on the light emitting nano-structures 150. Each light emitting nano-structure 150 may include a first conductivity-type semiconductor core 152, an active layer 154 and a second conductivity-type semiconductor layer 156 that are sequentially grown on the first conductivity-type semiconductor base layer 131.

The first conductivity-type semiconductor base layer 131 may be formed on the substrate 101 or the buffer layer 120. The first conductivity-type semiconductor base layer 131 may be formed of group III-V nitride semiconductors, such as GaN and the like. For example, the first conductivity-type semiconductor base layer 131 may be an n-GaN layer doped with n-type impurities.

The insulating layer 140 may be disposed on the first conductivity-type semiconductor base layer 131. The insulating layer 140 may be formed of a silicon oxide or a silicon nitride. For example, the insulating layer 140 may be formed of one or a combination of $SiO_x$, $SiO_xN_y$, $Si_xN_y$, $Al_2O_3$, TiN, AlN, ZrO, TiAlN, and TiSiN. The insulating layer 140 may include a plurality of openings exposing portions of the first conductivity-type semiconductor base layer 131.

The light emitting nano-structures 150 may be formed in positions corresponding to the openings of the insulating layer 140. The light emitting nano-structures 150 may have a core-shell structure including the first conductivity-type semiconductor core 152 grown on a portion of the first conductivity-type semiconductor base layer 131 exposed through the opening, and the active layer 154 and the second conductivity-type semiconductor layer 156 sequentially grown on a surface of the first conductivity-type semiconductor core 152. The light emitting nano-structures 150 may be exemplified as a rod structure, a top of which has a poly-pyramid shape. However, the present inventive concept is not limited thereto and the light emitting nano-structures 150 may have a different structure such as a pyramid structure and the like. For example, according to exemplary embodiments, the light emitting nano-structures 150 may include a nano-wire, a quantum dot, or a nano-box structure. Besides, the light emitting nano-structures 150 may have a structure having a sloped surface with respect to the substrate 101, and a cross-section of the light emitting nano-structures 150 parallel to the substrate 101 may have various shapes such as polygonal shapes such as a triangular shape, a quadrangular shape, a pentagonal shape, a hexagonal shape, and an octagonal shape, or a circular shape.

Figure 10:
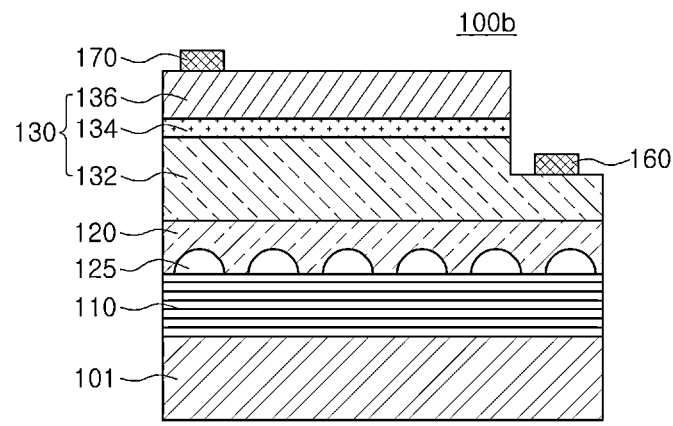
FIG. 10 is a schematic cross-sectional view illustrating a semiconductor light emitting device according to an exemplary embodiment of the present disclosure.

FIG. 10 is a schematic cross-sectional view illustrating a semiconductor light emitting device according to an exemplary embodiment of the present disclosure.

With reference to FIG. 10, a semiconductor light emitting device 100b according to an embodiment of the present disclosure may include the substrate 101, the reflective layer 110 disposed on the substrate 101, protrusions 125, the buffer layer 120, and the light emitting structure 130, and may further include the first electrode 160 and the second electrode 170 disposed on the light emitting structure 130. The light emitting structure 130 may include the first conductivity-type semiconductor layer 132, the active layer 134 and the second conductivity-type semiconductor layer 136.

The semiconductor light emitting device 100b according to the present embodiment may further include the protrusions 125 disposed on the reflective layer 110, unlike the semiconductor light emitting device 100 of FIG. 1. The protrusions 125 may protrude from an upper surface of the reflective layer 110 at regular intervals, and may have various shapes such as a dome, a polypyramid, a cone, a polyprism, or a cylinder.

The protrusions 125 may be formed of a material having a refractive index lower than a refractive index of the reflective layer 110 and the light emitting structure 130, and may also be formed of a light transmissive material. For example, the protrusions 125 may be formed of a light transmissive material selected from $SiO_x$, $SiN_x$, $Al_2O_3$, HfO, $TiO_2$, ZrO, ZnO and combinations thereof. When the protrusions 125 are formed of a light transmissive material, the protrusions 125 may correct a path of light without loss of incident light. The protrusions 125 may have low refractive indices, thereby correcting the path of the incident light in a direction close to that of a normal line, and may increase an amount of light reflected by the reflective layer 110.

Figure 11:
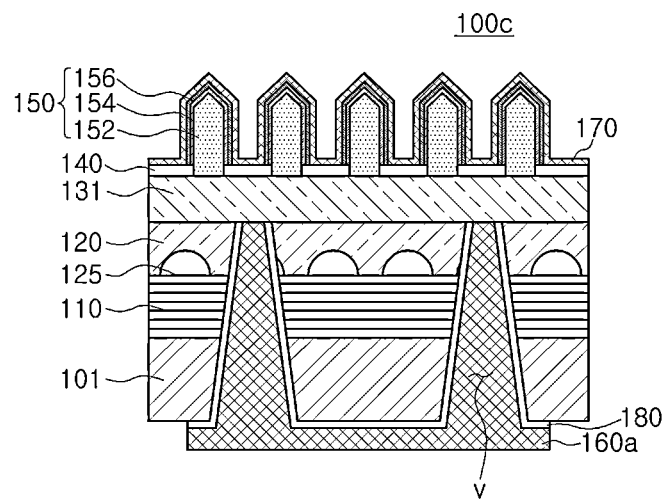
FIG. 11 is a schematic cross-sectional view illustrating a semiconductor light emitting device according to an exemplary embodiment of the present disclosure.

FIG. 11 is a schematic cross-sectional view illustrating a semiconductor light emitting device according to an exemplary embodiment of the present disclosure.

With reference to FIG. 11, a semiconductor light emitting device 100c according to an embodiment of the present disclosure may include the substrate 101, the reflective layer 110 disposed on the substrate 101, the protrusions 125, the buffer layer 120, the first conductivity-type semiconductor base layer 131, the insulating layer 140 and the light emitting nano-structures 150, and may further include a first electrode 160a connected to the first conductivity-type semiconductor base layer 131 and the second electrode 170 disposed on the light emitting nano-structures 150. Each light emitting nano-structure 150 may include the first conductivity-type semiconductor core 152, the active layer 154 and the second conductivity-type semiconductor layer 156 that are sequentially grown on the first conductivity-type semiconductor base layer 131.

In the semiconductor light emitting device 100c according to an embodiment of the present disclosure, the first electrode 160a may include conductive vias v penetrating the buffer layer 120, the reflective layer 110 and the substrate 101 and connected to the first conductivity-type semiconductor base layer 131, unlike the semiconductor light emitting devices 100a and 100b of FIGS. 9 and 10. The conductive vias v may be connected to one another below the substrate 101 to form the first electrode 160a.

The conductive vias v may be electrically insulated from the buffer layer 120, the reflective layer 110 and the substrate 101 by an electrode insulating layer 180. The conductive vias v may be extended to the interior of the first conductivity-type semiconductor base layer 131. The number and shape of the conductive vias are not limited to those illustrated in FIG. 11, and may be varied.

Figure 12:
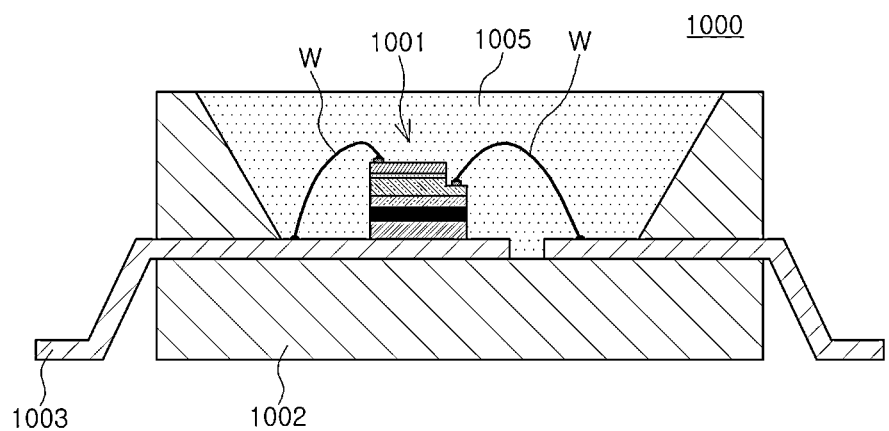
FIGS. 12 and 13 illustrate examples of a semiconductor light emitting device according to an embodiment of the present disclosure applied to a package.
Figure 13:
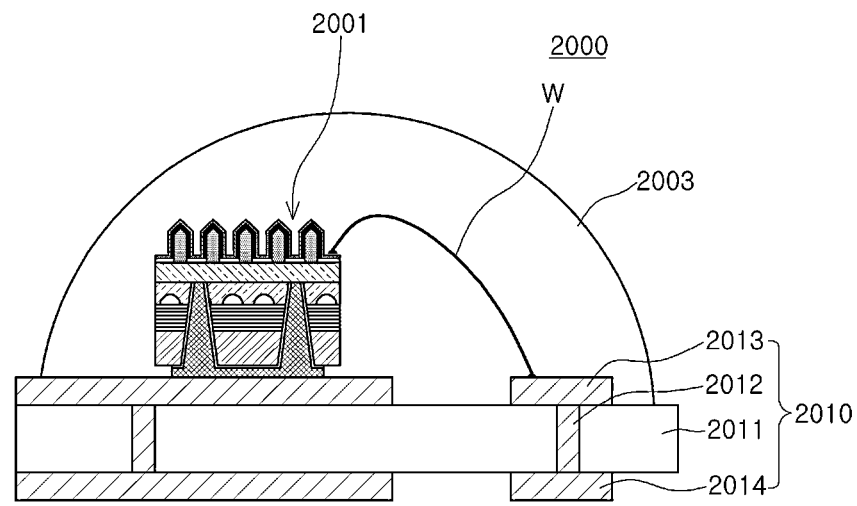

FIGS. 12 and 13 illustrate examples of a semiconductor light emitting device according to an embodiment of the present disclosure applied to a package.

With reference to FIG. 12, a semiconductor light emitting device package 1000 may include a semiconductor light emitting device 1001, a package body 1002, and a pair of lead frames 1003. The semiconductor light emitting device 1001 may be mounted on the lead frames 1003 and electrically connected thereto using wires W. According to exemplary embodiments, the semiconductor light emitting device 1001 may be mounted on a portion of the package 1000 other than the lead frames 1003, for example, on the package body 1002. In addition, the package body 1002 may have a cup shape having a cavity defined therein, such that light reflection efficiency may be improved. Such a reflective cup may contain a sealing body 1005 formed of a light transmissive material and sealing the semiconductor light emitting device 1001, the wires w and the like. In an embodiment of the present disclosure, the semiconductor light emitting device package 1000 may include the semiconductor light emitting device 1001 having the same structure as that of the semiconductor light emitting device 100 as illustrated in FIG. 1 by way of example. However, the semiconductor light emitting device package 1000 may include any one of the semiconductor light emitting devices 100a, 100b and 100c illustrated in FIGS. 9 through 11.

With reference to FIG. 13, a semiconductor light emitting device package 2000 may include a semiconductor light emitting device 2001, a mounting substrate 2010, and a sealing body 2003. The semiconductor light emitting device 2001 may be mounted on the mounting substrate 2010 and be electrically connected to the mounting substrate 2010 using the wire W and the first electrode 160a (see FIG. 11).

The mounting substrate 2010 may include a substrate body 2011, an upper electrode 2013 and a lower electrode 2014. In addition, the mounting substrate 2010 may include a through electrode 2012 connecting the upper electrode 2013 to the lower electrode 2014. The mounting substrate 2010 may be provided as a printed circuit board (PCB), a metal core printed circuit board (MCPCB), a metal printed circuit board (MPCB), a flexible printed circuit board (FPCB) or the like. The structure of the mounting substrate 2010 may be varied.

The sealing body 2003 may have a dome-like lens structure, a top of which is convex. According to exemplary embodiments of the present disclosure, the sealing body 2003 may be formed to have a lens structure including convex or concave portions on a surface thereof, thereby adjusting an angle of light emitted through the top of the sealing body 2003.

In an embodiment of the present disclosure, the semiconductor light emitting device package 2000 may include the semiconductor light emitting device 2001 having the same structure as that of the semiconductor light emitting device 100c illustrated in FIG. 11 by way of example. However, the semiconductor light emitting device package 2000 may include any one of the semiconductor light emitting devices 100, 100a and 100b illustrated in FIGS. 1, 9 and 10.

Figure 14:
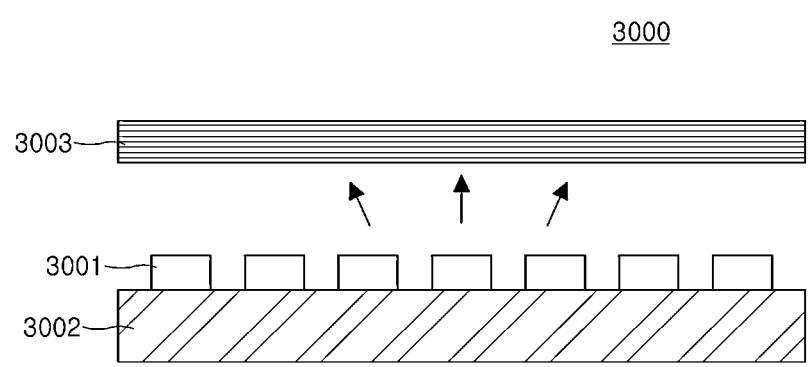
FIGS. 14 and 15 illustrate examples of a semiconductor light emitting device according to an embodiment of the present disclosure applied to a backlight unit.
Figure 15:
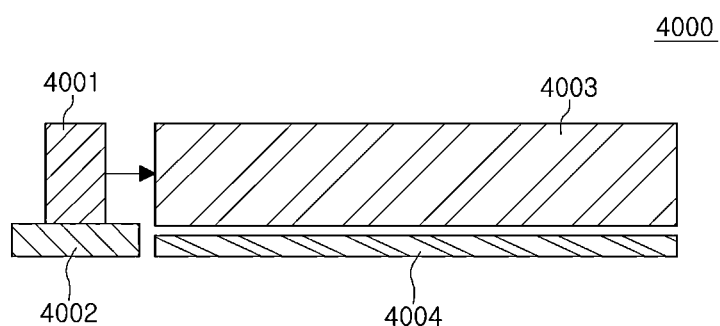

FIGS. 14 and 15 illustrate examples of a semiconductor light emitting device according to an embodiment of the present disclosure applied to a backlight unit.

With reference to FIG. 14, a backlight unit 3000 may include at least one light source 3001 mounted on a substrate 3002 and at least one optical sheet 3003 disposed thereabove. The light source 3001 may be a semiconductor light emitting device package having the same structure as the above-described structures of FIGS. 12 and 13 or a structure similar thereto, or a chip-on-board (COB) type package in which a semiconductor light emitting device is directly mounted on the substrate 3002.

The light source 3001 in the backlight unit 3000 of FIG. 14 may emit light toward a liquid crystal display (LCD) device disposed thereabove, whereas a light source 4001 mounted on a substrate 4002 in a backlight unit 4000 according to another embodiment illustrated in FIG. 15 may emit light laterally to be incident to a light guide plate 4003 such that the backlight unit 4000 may serve as a surface light source. The light travelling to the light guide plate 4003 may be emitted upwards and a reflective layer 4004 may be formed below a lower surface of the light guide plate 4003 in order to improve light extraction efficiency.

Figure 16:
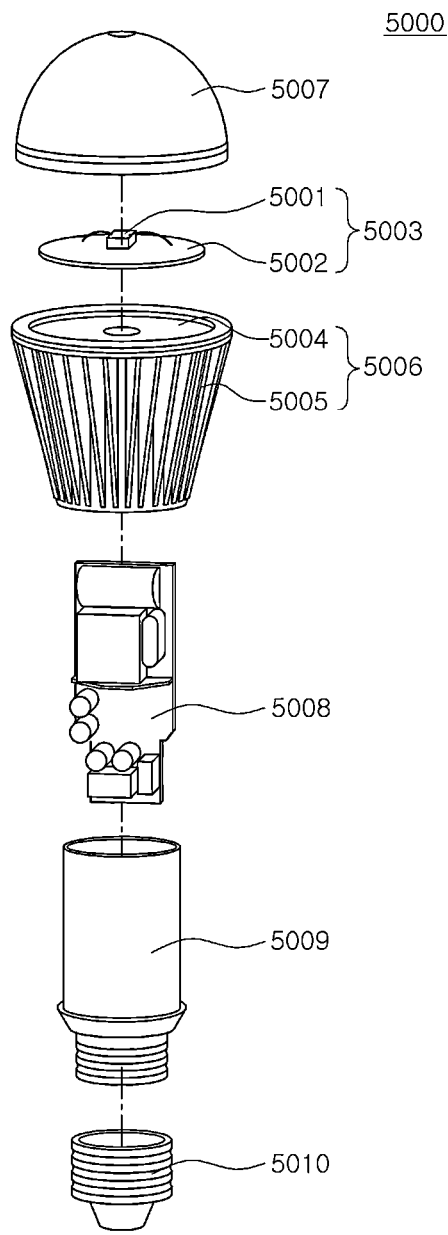
FIG. 16 illustrates an example of a semiconductor light emitting device according to an embodiment of the present disclosure applied to a lighting device.

FIG. 16 illustrates an example of a semiconductor light emitting device according to an embodiment of the present disclosure applied to a lighting device.

With reference to an exploded perspective view of FIG. 16, a lighting device 5000 may be exemplified as a bulb-type lamp, and may include a light emitting module 5003, a driving unit 5008 and an external connector unit 5010. In addition, the lighting device 5000 may further include exterior structures, such as external and internal housings 5006 and 5009, a cover unit 5007, and the like. The light emitting module 5003 may include a semiconductor light emitting device 5001 having the same structure as that of the semiconductor light emitting device 100, 100a, 100b or 100c of FIGS. 1 and 9 through 11 or a structure similar thereto, and a circuit board 5002 having the semiconductor light emitting device 5001 mounted thereon. In an embodiment of the present disclosure, a single semiconductor light emitting device 5001 may be mounted on the circuit board 5002 by way of example. However, a plurality of semiconductor light emitting devices may be mounted thereon as necessary. In addition, the semiconductor light emitting device 5001 may be mounted after being manufactured as a package, rather than being directly mounted on the circuit board 5002.

The external housing 5006 may serve as a heat radiating unit, and may include a heat sink plate 5004 in direct contact with the light emitting module 5003 to thereby improve heat dissipation, and heat radiating fins 5005 surrounding a lateral surface of the lighting device 5000. The cover unit 5007 may be disposed above the light emitting module 5003 and have a convex lens shape. The driving unit 5008 may be disposed inside the internal housing 5009 and be connected to the external connector unit 5010 such as a socket structure to receive power from an external power source. In addition, the driving unit 5008 may convert the received power into power appropriate for driving the semiconductor light emitting device 5001 of the light emitting module 5003 and supply the converted power thereto. For example, the driving unit 5008 may be provided as an AC-DC converter, a rectifying circuit part, or the like.

Although not shown, the lighting device 5000 may further include a communications module.

Figure 17:
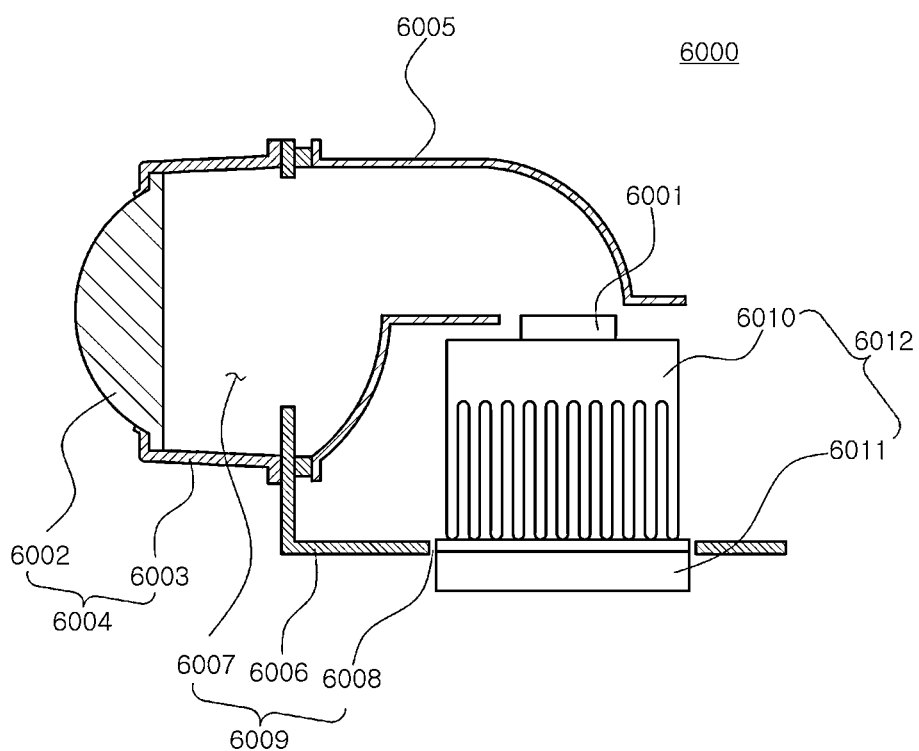
FIG. 17 illustrates an example of a semiconductor light emitting device according to an embodiment of the present disclosure applied to a headlamp.

FIG. 17 illustrates an example of a semiconductor light emitting device package according to an embodiment of the present inventive concept applied to a headlamp.

With reference to FIG. 17, a headlamp 6000 used in a vehicle or the like may include a light source 6001, a reflective unit 6005 and a lens cover unit 6004. The lens cover unit 6004 may include a hollow guide part 6003 and a lens 6002. The light source 6001 may include at least one semiconductor light emitting device package of either FIG. 12 or 13. The headlamp 6000 may further include a heat radiating unit 6012 dissipating heat generated in the light source 6001 toward the outside. The heat radiating unit 6012 may include a heat sink 6010 and a cooling fan 6011 in order to effectively dissipate heat. In addition, the headlamp 6000 may further include a housing 6009 allowing the heat radiating unit 6012 and the reflective unit 6005 to be fixed thereto and supporting them. The housing 6009 may include a body 6006 and a central hole 6008 formed in one surface thereof, to which the heat radiating unit 6012 is coupled. In addition, the housing 6009 may include a forwardly open hole 6007 formed in the other surface thereof integrally connected to one surface thereof and bent in a direction perpendicular thereto. The reflective unit 6005 may be fixed to the housing 6009, such that light generated in the light source 6001 may be reflected by the reflective unit 6005, pass through the forwardly open hole 6007, and be emitted toward the outside.

As set forth above, according to exemplary embodiments of the present disclosure, a semiconductor light emitting device may improve light emitting efficiency by adopting a reflective layer between a substrate and an active layer. In addition, the reflective layer may be formed of porous layers and a removing process of the substrate may be omitted, whereby manufacturing costs may be reduced.

While exemplary embodiments have been shown and described above, it will be apparent to those skilled in the art that modifications and variations could be made without departing from the spirit and scope of the present disclosure as defined by the appended claims.

What is claimed is:

1. A semiconductor light emitting device, comprising:
   a substrate;
   a reflective layer including three or more porous layers disposed on the substrate, the three or more porous layers including at least two types of porous layers having different porosities alternately stacked; and
   a light emitting structure disposed above the substrate and including a first conductivity-type semiconductor layer, an active layer and a second conductivity-type semiconductor layer,
   wherein the reflective layer includes a first porous layer having a first porosity and a second porous layer having a second porosity lower than the first porosity, and the first porous layer has a resistivity higher than a resistivity of the second porous layer.

2. The semiconductor light emitting device of claim 1, wherein the at least two types of porous layers included in the reflective layer include the same material as the material of at least one of the substrate, the first conductivity-type semiconductor layer and the second conductivity-type semiconductor layer.

3. The semiconductor light emitting device of claim 2, wherein:
   the substrate includes silicon (Si), and
   the at least two types of porous layers include porous Si.

4. The semiconductor light emitting device of claim 2, wherein the at least two types of porous layers included in the reflective layer include the same material as the material of the substrate.

5. The semiconductor light emitting device of claim 2, wherein:
   the first conductivity-type semiconductor layer includes GaN, and
   the at least two types of porous layers includes porous GaN.

6. The semiconductor light emitting device of claim 1, wherein the reflective layer reflects light generated in the active layer and travelling to the substrate, toward a top portion of the light emitting structure.

7. The semiconductor light emitting device of claim 1, wherein the first porous layer has a refractive index lower than a refractive index of the second porous layer.

8. The semiconductor light emitting device of claim 7, wherein a difference between the refractive indices of the first porous layer and the second porous layer is in a range of 0.1 to 1.3.

9. The semiconductor light emitting device of claim 1, wherein the at least two types of porous layers having different thicknesses.

10. The semiconductor light emitting device of claim 1, further comprising a buffer layer disposed between the reflective layer and the light emitting structure.

11. The semiconductor light emitting device of claim 1, further comprising a plurality of protrusions disposed on the reflective layer.

12. The semiconductor light emitting device of claim 1, further comprising a first electrode connected to the first conductivity-type semiconductor layer and a second electrode connected to the second conductivity-type semiconductor layer, wherein the first electrode includes a conductive via penetrating the reflective layer and the substrate and connected to the first conductivity-type semiconductor layer.

13. The semiconductor light emitting device of claim 1, wherein the at least two types of porous layers are alternately repeated twice or more.

14. The semiconductor light emitting device of claim 1, wherein the refractive indices of the at least two types of porous layers are lower than refractive indices of the substrate and the first conductivity-type semiconductor layer.

* * * * *